(12) United States Patent
Date et al.

(10) Patent No.: US 11,468,216 B2
(45) Date of Patent: Oct. 11, 2022

(54) METHOD FOR BUILDING A MODEL OF A PHYSICAL SYSTEM

(71) Applicant: PARI Automation & Industrial Infrastructure Limited, Satara (IN)

(72) Inventors: Ranjit Date, Pune (IN); Mangesh Kale, Pune (IN); Abhijeet Phatak, Pune (IN)

(73) Assignee: LINECRAFT AI LIMITED, Maharashtra (IN)

( * ) Notice: Subject to any disclaimer, the term of this patent is extended or adjusted under 35 U.S.C. 154(b) by 535 days.

(21) Appl. No.: 16/551,781

(22) Filed: Aug. 27, 2019

(65) Prior Publication Data
US 2020/0074029 A1    Mar. 5, 2020

(30) Foreign Application Priority Data

Aug. 28, 2018    (IN) .............................. 201821032236

(51) Int. Cl.
*G06F 30/23*    (2020.01)

(52) U.S. Cl.
CPC .................................. *G06F 30/23* (2020.01)

(58) Field of Classification Search
CPC .... G06F 30/23; G06F 30/00; G06F 2201/835; G06F 2201/80; G06F 2201/00; G06F 2119/00; G06F 2111/00
See application file for complete search history.

(56) References Cited

U.S. PATENT DOCUMENTS

| | | | |
|---|---|---|---|
| 5,799,311 A | 8/1998 | Agrawal et al. | |
| 5,831,853 A * | 11/1998 | Bobrow | G05B 17/02 |
| | | | 700/86 |
| 8,064,364 B2 | 11/2011 | Marshall | |
| 8,094,333 B2 | 1/2012 | Podl | |
| 9,218,628 B2 | 12/2015 | Wang | |
| 9,778,652 B2 | 10/2017 | Nausley et al. | |
| 9,842,175 B2 | 12/2017 | Steinberg et al. | |

(Continued)

OTHER PUBLICATIONS

Chen et al. "A Fault Propagation Modeling Method Based on a Finite State Machine". In 2017 Annual Reliability and Maintainability Symposium (RAMS), IEEE, 2017. pp. 1-7. (Year: 2017).*

(Continued)

*Primary Examiner* — Eunhee Kim
(74) *Attorney, Agent, or Firm* — Dickinson Wright PLLC (57) ABSTRACT

A method of building a model, including: receiving, a hierarchical tree structure representative of a system, the hierarchical tree structure defines a node associated with a hardware; collecting data associated with the hardware component, the data associated with a time stamp, the data comprises observational data associated with the physical system; derive, based on the data, node states of the node including first and second node states, wherein a first node state defines a first state of the node, and a second node state defines a second state of the node; building a finite state machine (FSM) model, the FSM model defines a sequence of states associated with the node, based at least in part on the time stamp, the FSM model is part of an overall finite state machine of the physical system; and creating the model of the physical system based on the overall finite state machine.

12 Claims, 6 Drawing Sheets

(56) References Cited

U.S. PATENT DOCUMENTS

| | | | |
|---|---|---|---|
| 9,977,425 B1 | 5/2018 | McCann et al. | |
| 10,305,734 B2 | 5/2019 | Dost et al. | |
| 2002/0023256 A1 | 2/2002 | Seawright | |
| 2007/0282593 A1 | 12/2007 | Thompson et al. | |
| 2010/0151817 A1 | 6/2010 | Linstrom et al. | |
| 2018/0032938 A1 | 2/2018 | Scriffignano et al. | |
| 2018/0137431 A1 | 5/2018 | Goldfarb et al. | |
| 2018/0157776 A1* | 6/2018 | Cerny | G06F 30/23 |
| 2018/0196409 A1 | 7/2018 | Ben-Bassat et al. | |
| 2018/0202431 A1 | 7/2018 | Freund | |
| 2018/0210436 A1 | 7/2018 | Burd et al. | |
| 2018/0210780 A1 | 7/2018 | Wang | |
| 2019/0018670 A1* | 1/2019 | Ramasamy | H04L 41/082 |

OTHER PUBLICATIONS

Lv, Chen, et al. "Multi-resolution modelling method based on time-state-machine in complex distribution network." IET Cyber-Physical Systems: Theory & Applications 2.4 (2017): 172-179. (Year: 2017).*

Wipliez, M., & Raulet, M. (Oct. 2010). Classification and transformation of dynamic dataflow programs. In 2010 Conference on Design and Architectures for Signal and Image Processing (DASIP) 2010 IEEE. pp. 303-310). (Year: 2010).*

Hooimeijer, Pieter. Generating String Inputs using Constrained Symbolic Execution. Diss. University of Virginia, 2008. 56 Pages. (Year: 2008).*

Jinjing, Z., Gang, Z., Yan, W., & Xiang, L. (Jun. 2010). Towards Detecting the Interaction Vulnerabilities in Large Distributed System. In 2010 10th IEEE International Conference on Computer and Information Technology (pp. 2843-2848). (Year: 2010).*

Ersfolk, Johan, Ghislain Roquier, Fareed Jokhio, Johan Lilius, and Marco Mattavelli. "Scheduling of dynamic dataflow programs with model checking." In 2011 IEEE Workshop on Signal Processing Systems (SiPS), IEEE, 2011. pp. 37-42. (Year: 2011).*

Zeng, Haibo, and Marco Di Natale. "Schedulability analysis of periodic tasks implementing synchronous finite state machines." 2012 24th Euromicro Conference on Real-Time Systems. IEEE, 2012. pp. 353-662. (Year: 2012).*

* cited by examiner

METHOD FOR BUILDING A MODEL OF A PHYSICAL SYSTEM

CROSS REFERENCE TO RELATED APPLICATIONS

The present application claims the benefit under 35 U.S.C. § 119(a) of Indian Provisional Application No. 201821032236 filed Aug. 28, 2018, titled "A System For Building A Model of A Discrete Manufacturing System And The Process For Its Performance Improvement Using This Model," the disclosure of which is incorporated herein by reference in its entirety.

BACKGROUND

Data gathering platforms can extract raw data from various components within a system, such as industrial devices operating on a manufacturing floor. The data gathering platforms can sample discretely or continuously across the different components and store the raw data with time stamps. In particular, the raw data can identity the status of sensors or actuators in a binary form, and process statuses or values of sensors in various formats (e.g., integer or floating point form).

Various tools are available to analyze and make sense of the raw data gathered from a particular system. For example, to analyze the raw data, data analysis systems include manually derived models of the particular system that define how the system is supposed to operate and perform. Depending on the complexity of the system being modeled, manually deriving a model is cumbersome and skill-based. As systems become increasingly complicated, it also becoming increasingly difficult to manually derive a model that completely and comprehensively defines a particular system. Additionally, when operations of the particular system begin to deviate in a new direction to a new normal or standard of operation, a new manually derived model has to be built to reflect the changes.

Analytic products can be used to make useful sense of the raw data. The analytic products enable users to manually select particular variables or time intervals of interest, where the analytic products present data in graphs or tables. Thus the analytic products are useful to users when they know specifically what they are looking for.

BRIEF DESCRIPTION OF THE DRAWINGS

For a detailed description of example embodiments, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. For example, the words "couple" or "couples" may indicate interaction between a set of machines (systems), or subassemblies thereof (subsystems). This means, that the systems and/or subsystems may not be electronically or mechanically attached with each other, but operation of behavior of a system or subsystem may affect the behavior of one or more coupled system or subsystem.

Example embodiments directed to Productivity Synthesis System ("PSS"), described herein, can be used to derive models for large, complex interlinked systems ("physical system"), where the physical system's behavior is linked with other subsystems conditionally or temporality as well as external events and factors that are not a part of the inherent model of the physical system, but which may affect the behavior of the system. Examples of a physical system include a car manufacturing assembly line, industrial production system, components operating within an Industrial Internet of Things (IIot), etc.

The PSS is a computer implemented system that can be used to model industrial production systems with minimal manual inputs. Specifically, the PSS automatically derives a model of the physical system (referred to herein as a "system behavior model"). In some instances, the derived system behavior model can be a digital twin of a particular physical system.

The PSS can generate meaningful analysis of the behavior of the system and make recommendations to improve throughput, performance, and reliability of a physical system. Furthermore, the PSS can generate meaningful analysis used to detect deterioration of the physical system, adverse events, and predict future failures and risks. The PSS can model higher levels of aggregates (than represent a combination of functional behavior that of lower level aggregates), and derive the higher level of analysis parameters associated with them. By modeling higher levels of aggregates of functional behavior, the PSS can generate analysis and recommendations with respect to functional behavior of the physical system, which can be subsequently drilled down to the raw data. In various embodiments, the analysis and recommendations are rendered for display to a user.

Furthermore, the PSS can take quality parameters, or parameters associated with quality, as an input, and correlate the quality parameters with various system behavior including the derived cycles and derived states, and predict possible future quality problems when such patterns are observed. The PSS may also record data about the physical system in non-production mode and build a complete history of the manual intervention for further analysis of results of deviations in the physical system or the physical system damage during manual operations, if any. In instances where the operational sequence of behavior of the physical system is changed including cycles or states, the PSS automatically detects the changes in behavior including possible new cycles or states and automatically creates a model or updates the preexisting model reflecting the changed behavior.

The derived system behavior model can be used to perform analytic studies and simulations. Additionally, the PSS can document and simplify the system behavior, knowledge, diagnosis and training for operation of the physical system.

Figure 1:
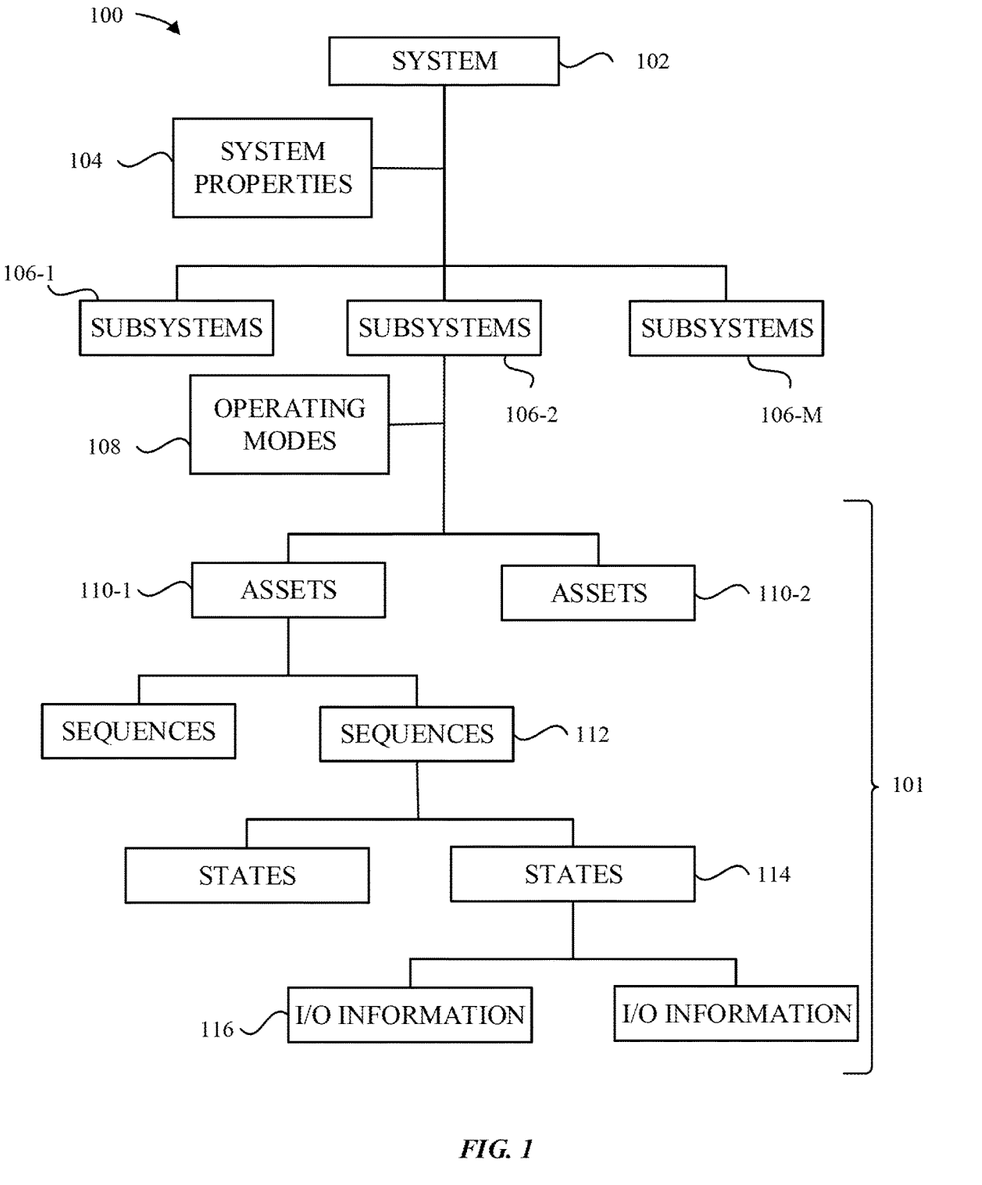
FIG. 1 shows a block diagram of an example reference system model.

FIG. 1 shows a block diagram of an example reference system model 100 suitable for discrete manufacturing systems. Initially, the synthesis system ("PSS") uses a reference system model, such as reference system model 100, to derive the system behavior model. The underlying PSS technology recognizes that physical systems (i.e., manufacturing systems) have the following common characteristics that can be used to define behaviors of a physical system including: finite state behavior; model of states; cyclic operation; interconnected nature; modular nature; hierarchical nature; performance measures; and external events.

A) Finite state behavior. Physical systems such as manufacturing systems are controlled using various sensors and actuators, which define a set of possible states of the physical system. The set of possible states are finite in number. Out of these states, a very small number of states are actually required for the meaningful operation of the physical system. The PSS is configured to identify and derive the finite state behavior of the physical system.

B) Model of States. The PSS is configured to identify and define the possible states, where each state is a unique combination of the information that is visible to the system. The PSS can generate a model of the various possible states, where a state "transitions" to another state when the unique combination of the information changed to a definition of another state.

C) Cyclic operation—Physical systems such as manufacturing systems operate in a repetitive fashion of identical or similar steps of operations, hence a cyclic sequence of such well-defined states. The PSS is capable of recognizing there may be multiple such cycles that can happen in the same physical system.

D) Interconnected nature—A complex physical system such as a manufacturing system consists of multiple systems, with each system operating with multiple cycles working independently for some part of the process, and interdependently with some other cycle for other parts of the process to achieve the overall manufacturing function. The PSS is capable of identifying, deriving, and defining the interconnected nature of the various nodes that represent various parts of the physical system.

E) Modular Nature—The size and complexity of the physical system can be better modeled by grouping the set of sensors and actuators in physical subsystems of a physical system, which define cycles of that physical subsystem, that constitute an aggregate higher level functional behavior of the physical systems, and then defining interactions in different physical systems. Any lower level of hierarchy can involve multiple cycles & state combinations under various conditions.

F) Hierarchical Nature—The physical systems exhibit a hierarchical nature through physical system characteristics that define modes of operation, setup for a specific function amongst multiple possibilities (like multi-part, multi-process equipment)—where when the physical system mode is changed, all the system components below it behave in a different manner.

G) Performance Measures—Manufacturing system performance expectations and optimization of performance are common and specific. These are typically (but not limited to)
  i. Effectiveness
  ii. Throughput
  iii. Process Capability and Stability
  iv. Cost Optimization
  v. Work In Process (WIP) optimization
  vi. Flexibility
  vii. Energy Optimization
  viii. Effluent/Waste Optimization H) External Events—Manufacturing system performance can be affected by external events over which the physical system neither has control over nor information about (i.e., shift of operation, a particular operator or line supervisor in charge, input material vendor, setups, interfaces with Enterprise Systems & MESs providing inputs for change of behavior, etc.). Performance measures and external events are analyzed at the system level 102.

The PSS, therefore, looks for these behaviors from the observed data and maps the system behavior model to the reference formulation. This formulation serves as a basis of further analysis, and interaction with users.

The advantages to this approach include creating a system behavior model that is easily interpreted by a human. The functional formulation enables interpretation of human perceivable actions, rather than raw data. For example, "digital input #7 turned on at time 03:07:42.2" (raw data) does not relay information that is as useful as "the press ram forward travel completed during a pressing step of the bearing pressing cycle that occurred after bearing presence was detected in the press tool." Both messages may be derived from the same input but the latter message is more easily interpreted by a human.

Additional advantages include a reduced complexity due to modeling of hierarchy, modularity and interactions. Accordingly, at any given time understanding and analysis may be, but not required to be, limited to only a specific module, including understanding the specific module's position in the hierarchy and its interfaces, without the knowledge of the entire physical system.

Another advantage includes the fact that a time dimension is embedded in the system model, making it possible to obtain and visualize a static picture (at any given time) of the physical system, a historic picture that can be used to understand how the physical system got to a specific state (historical step sequence), and a predictive picture that reflects what is expected to happen thereafter (future possible behaviors).

Because the system models follow the same reference model, a comparative analysis of patterns, behaviors, changes in the system models can be done. Additionally, it is easier to train personnel using the PSS, since the reference model is standardized.

During operations, the PSS creates and updates an operational "digital twin" of the physical system that is automatically created by the PSS. Accordingly, the original designer, design documentation of how the system was programmed to operate, or the computer code that governs the system operation is not required to make updates to the system behavior model or the "digital twin."

Figure 2:
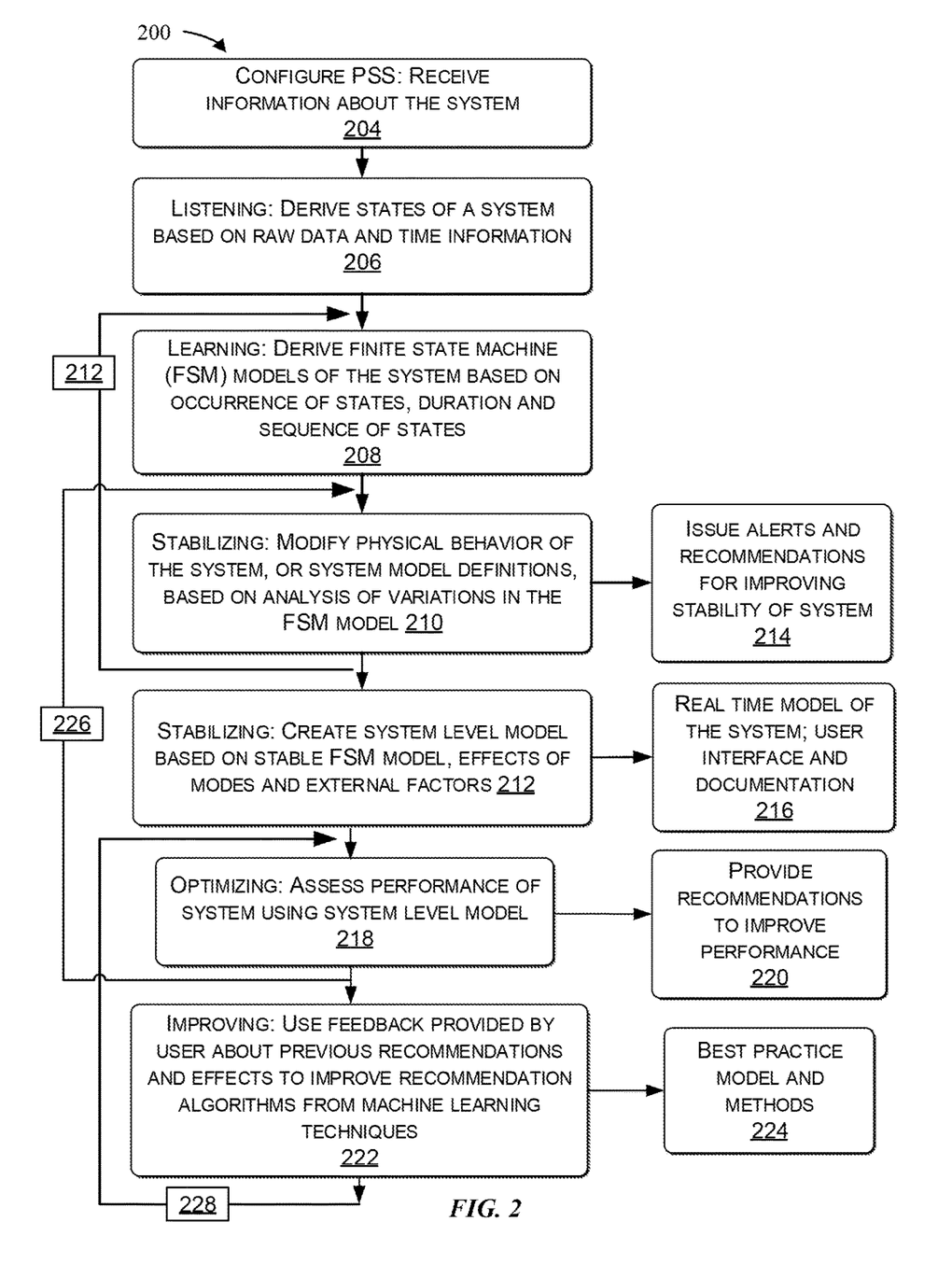
FIG. 2 shows a flow diagram in accordance with example embodiments.

FIG. 2 shows a flow diagram 200 of a standardization process of creating a system behavior model. The flow diagram illustrates a process to derive a system model with minimal human inputs. The PSS can automatically derive a system behavior model that matches the expected behavior with minimal information about the physical system defined by the user. Each of the steps after the step 204 in flow diagram 200 occurs automatically without requiring user input. That is, in all the steps in flow diagram 200, there is "auto" learning and analysis where without a user trigger, initiation, or query, the PSS generates and updates the deliverables (e.g., 214, 216, 220, and 224) by applying self-learning techniques.

Although user input is not required for the PSS to generate the deliverables 214, 216, 220, and 224, a user may also provide inputs to the PSS to refine the system behavior model, manually override some of the auto-analyzed parameters, provide evaluation of the correctness or usefulness of recommendations provided by the PSS, perform analysis through a user interface, and set up queries and analysis as required.

The standardized process begins (204) with receiving information about the system. Information received may include what is contained in the system, the objectives of the system, and where this information is available in the data. A user does not need to specify how the physical system works or is supposed to work. Nor does the user need to provide any model information or a "digital twin" of the system.

A user may provide the following information to the PSS: system content; define sensors, actuators and their data sources; other variables from physical system controller memory not related to sensors and actuators which are relevant to define states and external events and user defined events; manually derived states; define existence of standard system modes of operation; and external events; other inputs and outputs and memory variables which are relevant to analyze quality parameters (e.g. but not limited to welding current and voltages and wire feed, part machining automated quality check result etc.), production part history parameters (e.g. but not limited to part number, part type), system intrinsic parameters for measuring the actuator health behavior (e.g., but not limited to motor currents and voltages, vibration sensors) or any other possibly relevant analysis of the output of the system (e.g. but not limited to input power to the system, air flow to the system). Each type of information that may be provided by a user is described further in turn, below.

Defining system content—The user may define the assets (generally stand-alone and independent equipment used in the line) or the physical content of the system (like storage/buffers as well as logical interconnections between assets, IT system interfaces, data interface points, etc.). Additionally, the user may provide a breakdown of the subsystem and their subcomponents, components as per their logical construction (e.g., in a hierarchical tree structure). A user may define nodes of the various assets down to the smallest aggregate levels in the physical system that exhibit cyclic behavior of operation, which are independent of the cycle of the other nodes, except for temporal interface conditions. A user may also name the content and functional objectives of the cycles defined by the nodes. The system content is thus defined as a hierarchical tree structure of "nodes"—top node of which is the entire system in scope of the PSS, at an intermediate level are the assets or other physical content nodes, and at the leaf level are the I/O and variable nodes.

The system content is thus defines as a hierarchical tree structure of "nodes"—where the top node represents and captures the entire system in scope of the PSS, at an intermediate level are the assets or other physical content nodes, and at the leaf level are the I/O and variable nodes.

Defining sensors and actuators and their data sources—A user may define sensors, actuators, and their data sources for information about them for each Leaf Node. The PSS has the ability to model various actuators and sensor with placeholders for inputs, outputs, and state equations for the actuators and sensors. The PSS also has the ability to write simple state equations of various stales that the actuators and sensors can be in.

Data associated with the Leaf Nodes provides information about their status (e.g., digital I/O, flags, variable values (like CNC system coordinates, measurement values, etc.)). Data associated with the leaf nodes are collectively referred to as Leaf Node Data ("LND"). A user has the ability to specify the data sources like physical addresses of the inputs and outputs from the industrial controllers, variables used in the controllers, or sources of multivalued variables like axis numbers, or sensor value addresses to define LND. A user has the ability to define and use model libraries of typical such actuators and sensors as binary (Boolean variables) or continuous variables using floating point/non-binary data. The specific instances of LND with values with timestamps are called Leaf Node Values ("LNV"). Further, a user has the ability to provide data in addition to LND to define External Events ("EED"). This data may be any variable in the physical system accessible to the PSS. The PSS also has some pre-defined variables including but not limited to time of the day, date etc. that can be used to define External Events.

Defining manually derived states—A user also has the ability to write Boolean equations of various LND to create combinations of LND. These manually entered state equations are termed as Manually Derived States (MDS). A user can also define value ranges for multi values variables (like servo axis position) that quantizes the variables into a limited number of values.

Definitions may be simplified through the use of various template-based actuators and sensors. The template-based actuators and sensors have defined inputs and outputs, and state equations using the input and output variable placeholders. The PSS has the ability to add such template-based actuators and sensors when they are used in the physical system. This allows the PSS to enable understanding the "action" states of the actuators, either through known templates or custom templates created for previously unknown actuators. These action states are further used to determine the dynamic behavior of the states. This enables the PSS to understand the "action" states of the actuators, either through known templates or custom templates created for previously unknown, undefined, or unidentified actuators. These action states are further used to determine the dynamic behavior of the states.

Additionally, a user may define MDS for non-leaf nodes, where the non-leaf nodes are parent nodes in the hierarchy—as a combination of LND of its child nodes and other data points captured by the PSS from the physical system controllers as described above.

Defining conditionally coupled node—The various nodes can demonstrate different behaviors with respect to one another. The various nodes may exhibit behaviors such as: decoupled behavior with another node (for example two independently functioning machines); conditionally coupled (two nodes coupled during an "interface" condition where the two nodes are working in conjunction with each other for some time—for example a machine and an automated robot loader); and coupled (one node fully dependent on another node, such that these nodes need to be treated as a combination of such nodes to enable their actions—for example various subsystems within a machine).

Thus, with respect to a first and second node, the nodes may operate in a decoupled state, a conditionally coupled state, or coupled state. As between the first and second node operating in a decoupled condition, the first and second nodes operate as independently functioning machines. As between the first and second node operating in a conditionally coupled manner, the first node is coupled with the second node when an "interface" condition occurs where the first and second node work in conjunction with each other for some time—for example a machine and its automated robot loader. As between the first and second node operating in a coupled manner, the nodes are fully dependent on each other, such that the nodes need to be treated as a combination of the two node to enable their actions—for example, various subsystems within a machine. For example, an interface between the first state of the leaf node and an additional state of a different leaf node may be defined as the first state occurring in response to a condition of the additional state of the different leaf node.

Top decoupled nodes (TDNs) are parent nodes for which they and all their children can be considered as coupled. In some embodiments, a top decoupled node can be either decoupled or partially coupled with other TDNs.

Defining existence of standard system modes of operation—A user may also define "system modes" of operation of the physical system and typical LND associated with a respective system mode. Some modes that may be defined are, but not limited to, Autocycle Mode, SemiAuto Mode, Manual/Teach/Interactive Mode, Fault/Non-Operating Mode and the like.

Defining external events—A user may also define external events, which are not part of the system model or part of information available to a control system of the physical system, but nonetheless impact or affect the behavior of the system. The external events may enable the PSS to better analyze behavior of the physical system.

The various user inputs described above may be directly entered into the PSS through a user interface (manual input)/data connection to other systems and sensors.

Next the PSS may perform a listening step (206) where the PSS derives system states and analyzes them. The PSS collects data to build the system behavior model and captures Leaf Node Data. Data collection can be done online. System behavior model and analysis can be done online or offline. The PSS collects data when the PSS is connected to the physical system. In the online mode, the PSS may build the system behavior model and perform analysis simultaneous to the data collection. In an offline mode, a data logging subsystem of the PSS may be connected to the physical system at various points of time, and then the data is uploaded in to the PSS for model building and analysis later on.

Other types of data may be collected in a similar fashion (e.g., manual inputs, external system interfaces (for example customer shop floors and enterprise systems, and the like) where data with time stamps may be collected online or offline for the PSS to perform model building or analysis. In one example, various IIoT platforms may provide data to the PSS from manufacturing systems controlled by hardware and software from diverse manufacturers (e.g. but not limited to, Siemens—Mindsphere, GE—Predix, ABB—Ability, Fanuc—Field, Kuka—Connyun). In other examples, such platforms may not be used, but instead the data may be in native data formats of the machine controllers (e.g., PLCs through OPC servers). The PSS can work with any form of data that provides the PSS with the LND defined in configurations. One example of the LND defined in configuration may be in the form of a table of LNVs.

Typical large systems have a large amount of input/outputs ("I/Os"), and in-memory data relevant to physical system behavior, that change fast and frequently. If states were defined using all sets of I/O information available to track every change, the number of states would explode, and the analysis would become highly computationally heavy, and the results become increasingly difficult for a user to interpret. For example, a typical engine assembly line may have 10,000 data points of information, even with 9,900 binary, and 100 floating point. Even if floating point variables are quantized in 10 quanta in their bounds, all possible combinations of all this data will result in more than ($2^{9900}*10^{100}$), meaning more than $10^{3080}$ states, making modeling and analysis nearly impossible in finite time.

However, the PSS utilizes an observed phenomenon in physical systems where a large percentage of the possible combinations are improbable (most combinations of the variable values will never occur, although possible in theory). Even those that do occur can be significantly reduced in numbers by decoupling the variables limited to the nodes since the variation of information in decoupled nodes are "don't care" conditions for states in that node.

Using this observed phenomenon, the following algorithm may be used to create states.
1) Tabulate LND on a common timeline, over a reasonable period of time, providing reasonable number of samples, allowing each of the state of the system to have occurred numerous times.
2) Observing the LND only within a node, such that the change of LNV can uniquely signal specific states that the node can exist in. This limits combinatorial explosion—both by elimination of states that do not occur, as well as isolating the LNV changes outside of the node to confuse them with additional states for this node.
3) Ability to simplify & verify the leaf node model using the time stamped raw data,
   a. Graphic display of actually collected data and derived MDS for leaf nodes, and displaying time intervals where no modeled MDS is active, to allow user to correct the model
   b. Automatically splitting and modifying definition of MDS if two MDS become active at the same time due to inaccuracy of the manually input model, and creating additional states known as Derived Intrinsic States ("DIS"), so that only one state is active at one time
   c. For multi-valued LNV where due to multiple values will explode the number of states, ability to define zones or bands for "quantization" of these variables to limit the number of states. This can be done by Auto-analysis (PSS suggesting the "stable" value ranges by statistical analysis), or interactively (PSS displaying the graph of values in relation with the other variables for the user to interpret and define the range of values to quantize the states.
4) Ability to analyze entire combination of states observed and deriving the states of the parent nodes hierarchically above the leaf nodes and progressively upwards till the root node
   a. Ability to define and evaluate Manually Defined States for parent nodes b. Ability to derive "Derived Extrinsic States" (DES), which are unique combination of the observed states of all the children of a parent
c. Ability to use the data of MDS and DES for any node and derive the DIS for each node
d. Ability to use the coupling conditions to derive additional DES and DIS when the coupling condition is instantiated In one example, implementing the above algorithm resulted in about 10,000 states, which lead to a highly simplified model for analysis. After the states within each node are defined, the entire range of operation steps of the node are uniquely described by one of these states. Each state has the following characteristics: State begins as a change of LNV from a certain unique combination to another unique combination ("Start transition"), and then ends with another such unique combination ("End Transition"). Since the node must always be in one and only one unique state, end transition of one state must coincide (within one data sampling interval of possible lag) with start transition of one and only one other state.

When a sufficient number of the LNV data over sufficient time is available, multiple instances of these states are available for analysis. The following analysis is then performed to classify the states for further analysis:
1) Time Behavior Type of state: Based upon the duration of each state (from start to end)
   a. Fixed States: States that demonstrate fixed time behavior, within a fairly tight statistical tolerance band—ignoring outliers. This is typically the case for Boolean actuators with fixed task (for example clamp open/clamp closed/part gripped/etc.)
   b. Bound States: States that lie bound within a specific interval of timings, and exhibit this behavior within a tight statistical band ignoring outliers. This is typically the case for actions that have variable travels or speeds of action in the process.
   c. Variable States: States that show a large variation of timings, without specific bounds and statistical band. This is typically the case when the state is dependent upon some unstable or uncontrolled physical behavior (which is an undesirable characteristic for the system, hence the first step to improve the system stability), or a waiting type of state—where the end of this state is dependent upon another state that is outside of this node (for example, this actuator cannot start an action unless another device that belongs to another node clears out of its way), or external to the system (like waiting for operator to load a part).

Dynamic Behavior of the State
   a. Action State—where there is some action happening. Dynamic states correlate to potential productive behavior of the system—since a typical manufacturing system should be performing some actions to produce.
   b. Static State—when there is no action happening, but still might be required for the enabling conditions like interfaces between nodes, availability of precondition of operation, etc. When the states are not dependent on other nodes or external events, states transition from one action state to another, without any static state in between, whereas when they are dependent, they have to wait for outside state transition. Static states normally represent non-productive behavior The PSS performs the time behavior analysis automatically ("Auto Analysis") and provides these findings of classification of these states to a user, where the user can confirm the accuracy of a classification of override the classification. A user may override a classification when his understanding of the expected system behavior deviates from behavior observed by the PSS. For example, say the "gripper close" state took between 2 to 4 seconds in the observation with a tight statistical bound, hence the PSS classified it as bound state. The user realizes that this is happening due to dirt on the finger guides sometimes makes this finger sticky, and normally what should take 2 seconds can take up to 4 seconds, which by coincidence happened to be limited to 4 seconds. In this example, the user may choose to override the state type definition to fixed state.

The PSS performs the action behavior type analysis automatically (without user prompting or input). For the mixed state analysis above, when such mixed states, and their interfacing nodes are identified by the user, the PSS also performs the analysis automatically to identity the interface states.

Figure 3:
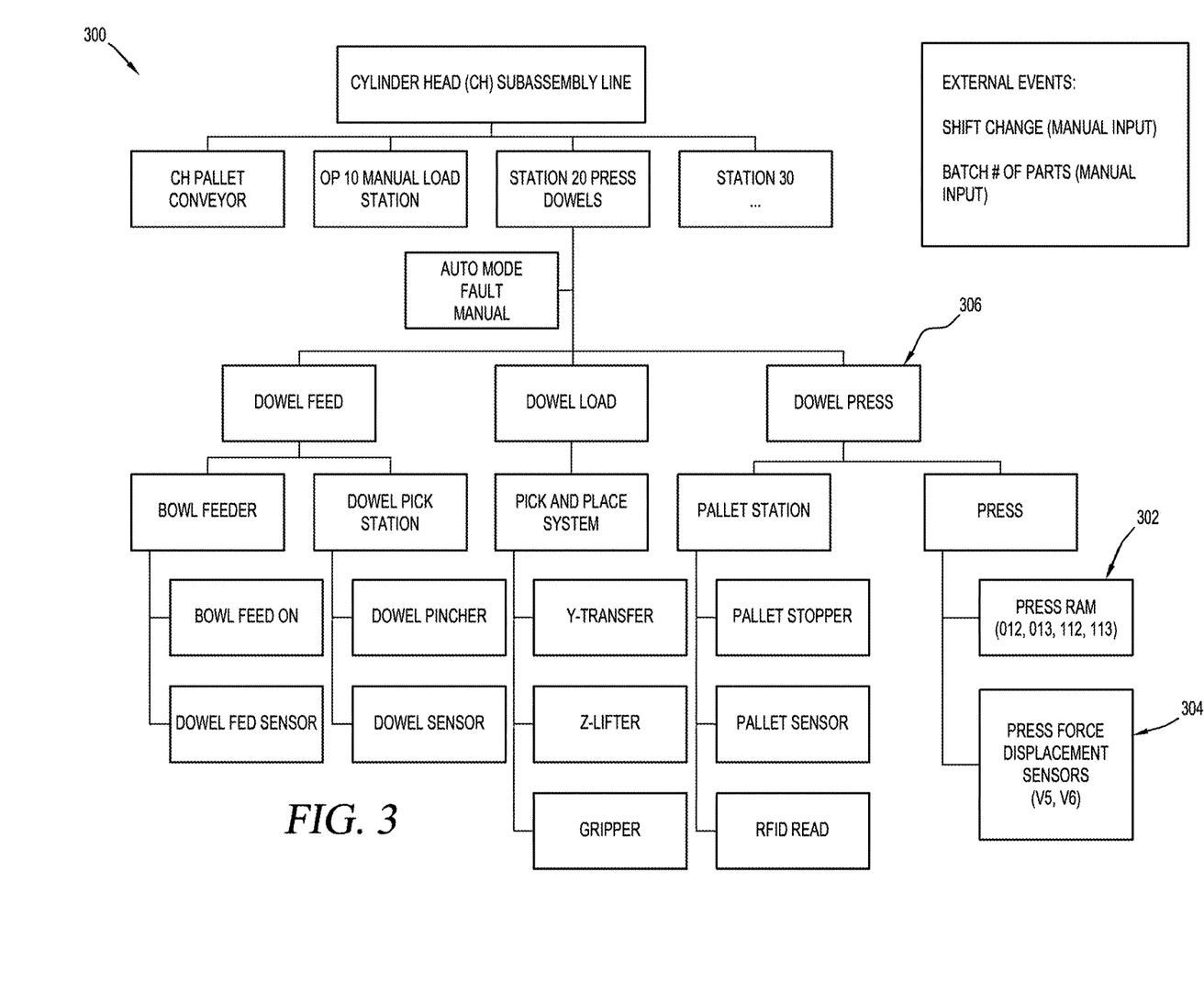
FIG. 3 shows a block diagram of example system information.

FIG. 3 illustrates a block diagram 300 depicting information that may be used to initially configure the PSS. Block diagram 300 illustrates only a few components expanded for demonstration. Blocks 302 and 304 includes identified Leaf Node Data, which may be identified for components in the leaf nodes.

To demonstrate the example of the Listening function (block 204 in FIG. 2), example node 306 in FIG. 3, "Dowel Press" is discussed. During the Listening function, the states observed in this case may be:
1) Pallet Present
2) Pallet Traveling/Not Present
3) Ram Up
4) Ram moving down
5) Ram Down
6) Ram moving up Subsequent to recognizing states during the listening functions, the PSS may proceed to a Learning function (block 212 in FIG. 2). The PSS now possesses the higher level of ability to continuously solve the state equations to know what state the system is at all times, and therefore the sequence of states encountered. These sequences have the following properties:
1) Different nodes will have different states at any given time, and most of the times, these sequences will happen asynchronously (without any timing relationship) with one other.
2) Interacting actions between the nodes may result in specific states to synchronize (a state in one node waits for another state from another node to finish), for specific times. Thereafter, once again the sequences can continue in unsynchronized manner.
3) A sequence of specific states happening one after another in a specific order, repeatedly, is a typical nature of manufacturing operations.
4) The desirable (productive) operation of the system will progress through a finite number of such sequences for each of the nodes.
5) The repetitive operation requires "cyclic" behavior—a sequences of states that repeats one after the other. Therefore, any of these states can be taken as a "home" state, and the cycle can be thought as a sequence from home state to home state.
6) When the node has multiple cycles, the cycles have at least one common state that can act as a home state for all cycles. However, the PSS can predict which states are candidates for Home states, and a user can define separate home conditions for each cycle, resulting in multiple possible home conditions for a leaf or a parent node.

7) The entire FSM of a node is then visualizable as a set of cycles connected at home states.
8) The entire FSM of the system is visualizable as FSMs for the individual nodes, interfaced at specific states between the nodes.
9) There are specific exceptions to the cyclic behavior of the system expected in the manufacturing systems (defined by "System modes"). For example, manual mode, and fault mode are non-cyclic operations.

Based on the above described behaviors of the systems of interest, the PSS works with the below algorithm to derive the cycles and the complete FSM of the complete system.

1) Continuously generate unique states at every time sample for every node using recursive solver. Various embodiments can include continuously monitoring for a state change. Additional embodiments can include sampling at different time intervals and comparing states.
2) Filter out the data of states occurring in non-cyclic system modes of operations—like Auto mode & Manual mode for the purpose of model building. However, data is gathered at all times.
3) Identify the repeating sequences from the states order of occurrence in cyclic system modes.
4) Analyze automatically potential Home states for definition of cycles, and add it in configuration information when confirmed by or selected differently by the user.
5) Build a "Finite State Machine" (FSM) model of each of the nodes and all of the cycles experienced by the node.
6) Build a FSM of the entire system by connections of node FSMs through interfaces between states.
7) Observe the data sources and automatically derive derived extrinsic states ("DES") and derived intrinsic states ("DIS") which may not be observed during the Listening Phase (block 206 in FIG. 2), and create additional FSM models if required.
8) Observe the coupling conditions and if true, evaluate the DES, DIS and MDS of the coupled node
9) Analyze multiple instances of cycles to identify their temporal behavior, and statistics
10) Analyze unmodeled possibilities of variability of cycles. For example, an unmodeled possibility may include different "operational modes" like running with different setups of part variants, partial line operation, etc. The PSS may present similar probabilities of occurrences of cycles as possible operational modes and update the configuration of user verified operational modes.
11) Analyze variability of cycles beyond operating modes, for example, with respect to correlation with external events, to enable reporting recommendations to the user to create stable cycle behavior. For example— more occurrences of manual modes/faults in second shift than the first shift, more calibration cycle frequency with input material from one vendor with respect to another, etc.
12) Analysis of similarity of sequences based upon heuristics & machine learning for minimizing the number of types of cycles for further analysis.
13) Analysis of interactions between assets: interactions where one asset waits for another asset to be in a requisite state.
14) Analysis of interfaces between assets, where both assets are working together, hence each state is jointly affected by both assets during this interface.
15) Identifying assets independent cycles—e.g., a sequence of operations required for the asset to work. An independent cycle can be defined herein as a "self" or "own" cycle (sequence of operations required for an asset to work without waiting for other assets, but including interface actions as above) and then computing self cycle time (time required to complete own work) to identify critical & near critical assets and their critical cycles (mote time impacting cycles). The independent cycles of the asset do not involve waiting for other asset, but can include interface actions as described above. After identifying independent cycles of an asset, computing the independent cycle time (time required to complete independent work) to identify critical & near critical assets and their critical cycles (e.g., a critical cycle is defined as a cycle with a greater time impact)

After the PSS defines cycles, additional configurations steps may provide the PSS with inputs about the system performance expectations, and where this information is to be obtained (e.g., which transitions of which states represent the events that represent the expected performance).

Further, the PSS has the ability to define "Good Events," also in the form of end of a state or logical conditions of the above information, which are desired performance parameters, and "Bad Events," which are the entry of states or other logical combinations that represent events associated with adverse performance. In some examples, a good event results in the physical system meeting a performance parameter. In additional examples, a bad event results in the physical system failing to meet a performance parameter. In addition, the PSS has the ability to define other "Analysis Events," which are entry, or exit from states, which may be defined by a user for specific focused analysis.

Figure 4:
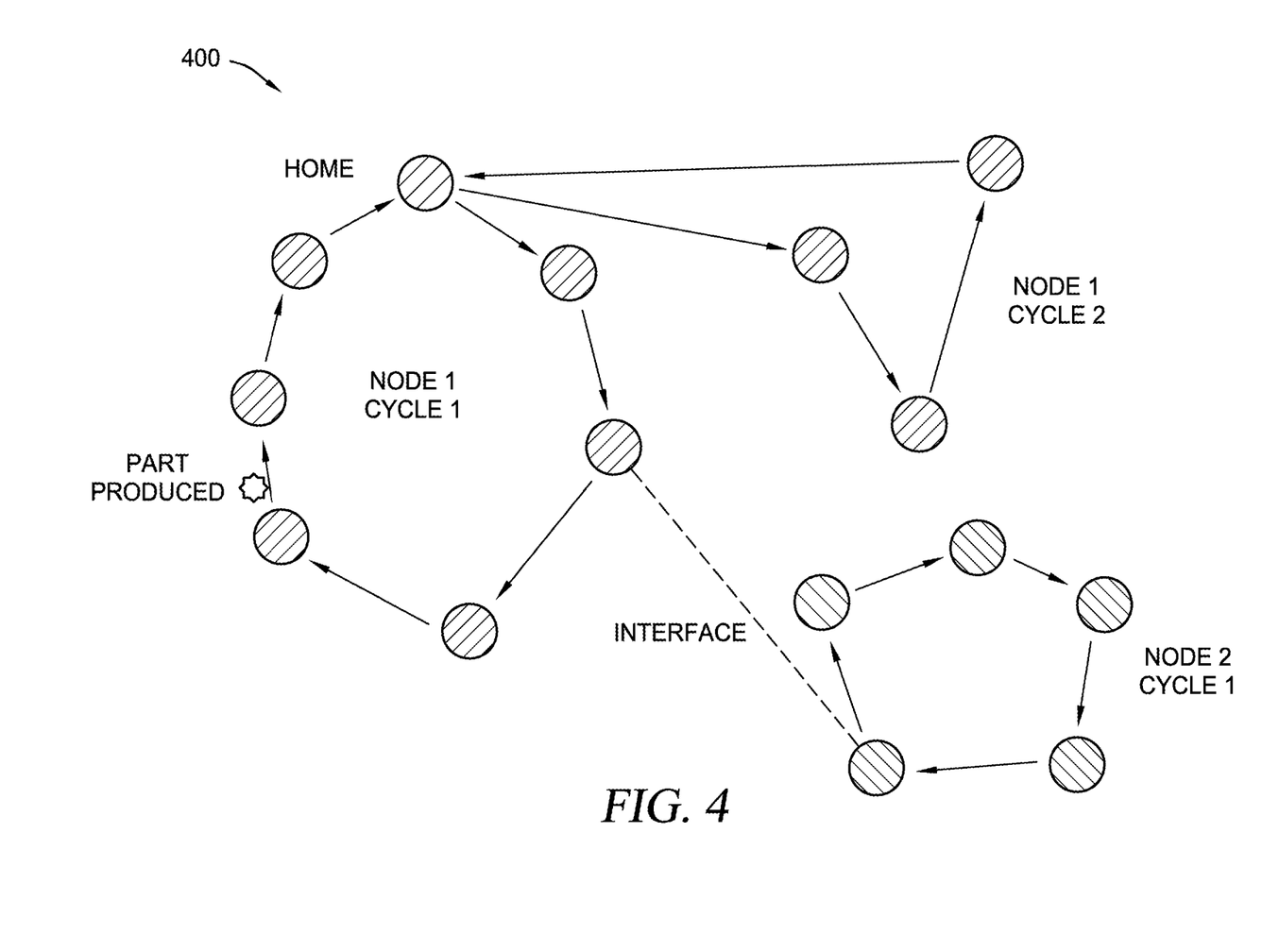
FIG. 4 shows an example finite state machine.

Further, the PSS has the ability to attach information that can be converted into performance measures (e.g., performance parameters) for further analysis like throughput, production of a part, quality measurements, costs incurred, human effort used, energy or consumables consumed, count of parts adding to the WIP (work-in-process) in the system, for which the system performance needs to be optimized An example FSM model with multiple nodes and cycles is shown in FIG. 4.

Once the sequences and cycles are observed from the FSM, the PSS matches the system behavior to a maximum consistent and stable repetitive observation of these sequences (block 210 in FIG. 2). Even if the behavior is not consistent, it tries to define further higher levels of modal behavior when it exists, or guides the user by highlighting the inconsistencies when they result from undesirable instabilities (like unreliability, faults and break-downs). The following steps and analysis may be performed during a Stabilizing function:

1) Stability of States
2) Stability of Cycles
3) Stability of Cycle frequencies within each mode
4) Using the statistics to look for a consistent behavior of the system, and analyzing inconsistencies until the inconsistencies are attributed to and corrected into a consistent behavior model:
a) State variability classified into the following types, and modeled accordingly:
   i) Inconsistent behavior of the system—due to unreliability of the mechanical, electrical or software controls or operation—which are basic issues with the system that get identified and reported to the user for correction, in due course.

ii) States of the system that depend upon interdependence on other states—either internal to the system being modeled, or external, hence based upon these events, the states "wait" for variable timing to synchronize their timings. These are identified as interfaces with the identified interdependencies.

iii) Bound duration states—due to systems own design, a certain variation within the timing bounds are expected to be present, and such states are classified with those timing ranges and their statistics.

b) Cycle variability classified into the following types, and modeled accordingly:

i) Differing timing in repetitive cycles—although the timing variability of cycles is attributable to variation in underlying state timings, their impact on the system performance in terms of the "critical" cycle that determines the throughput or other performance events ("Good Events") is analyzed to provide prioritization to the user of control on states.

ii) Abnormal sequences—not following a cycle consistent with the previously modeled cycle. These can be either verified as abnormal, hence reported to user for stability improvement actions, or special conditions leading to this special behavior can be modeled in the system into "modal" information.

iii) Expected cycles, but relatively unstable probabilities—these are reported to a user as potential stability improvement, or derivation of further "modal" information to model new modes of operation (block 214 in FIG. 2).

c) Modal Variability i) Identifying the performance of the various modes in terms of the system performance measures like throughput, quality parts, costs, etc.

ii) Identifying the relative stability of frequencies of the modes, and their variations, and their impact on the performance of the system.

5) Through the above steps, achieving a consistent model of the system that can be used as a benchmark of the system behavior, its performance, and the various interactions that affect them.

6) When the physical system behavior is improved or optimized to change the system behavior model, the above steps are taken incrementally to enable deriving and modeling the changed system behavior model, to keep track of the most current system behavior model, as well as the changes with respect to the prior system behavior models with chronology and traceability (who did what and when to change the system behavior model).

After the above process, the PSS creates a human understandable model (block 212 in FIG. 2) where resulting deliverables may include the real time model of the physical system, a user interface, and documents (block 214 in FIG. 2). That is, after performing the above process, the PSS creates a complete system behavior model of the physical system in complete hierarchical and modular behavior of the physical system. The system model behavior increases the understanding of the physical system. Useful deliverables of the PSS at this point include a system behavior model that is documents graphically as well as in text with the complete functional hierarchy including all sensors and actuators. The operating model of the physical system is captured in the forms of flow diagrams, cycle diagrams, timing diagrams, at three levels: modes, cycles, and states.

The model is integral to the user interface of the system for the PSS, that enables a user to "drill down" (move down through the hierarchy) or "roll up" (move up through hierarchy) to achieve a particular level of detail to help his understanding. The model can also be "panned" (forward or backward) or "zoomed" (in or out) in time to visualize the temporal behavior of the system at the desired resolution.

The PSS may also be used to create specifications and documentation of performance and its affecting factors including cycle times, throughput, quality, costs, and consumables. Documents may also include documentation about the cause and effect of various causes of variability and the method of their improvement.

Additional deliverables of the PSS include creation of a Digital Twin model that can be used in simulations and studies of model changes and effects (like what-if studies, verification & validation for new model introduction, etc.) and analysis and debugging information to debug and diagnose issues in control systems software like PLC code.

Further, the PSS may provide additional deliverables such as providing recommendations to improve performance (blocks 218 and 220 in FIG. 2). Using the system behavior model above, the PSS identifies opportunities for improvement (e.g., a hidden capacity of the system), and reported to a user to further improve performance of the system, through the following methods:

1) Creating the "minimum" time requirements for cycles—through analysis of state types and their behaviors to identify the fastest possible cycle if each state can be optimized to its minimum possible timing.

2) Identifying "critical" cycles (cycles having highest minimum timing), and verifying the causality with the line throughput.

3) Identifying opportunities in each of the slates in the critical cycles for previously encountered evidence of optimization possibilities, and reporting them to the user for optimization.

4) Identifying the wait states, and their causes (like blocked and starved states due to interdependencies with other cycles, waiting for external events, etc), and reporting them to the user for optimization.

5) Analysis of external events and their correlation of performance to provide the user actionable information about improvements in external influences required to improve or maintain the performance.

6) Correlation analysis with internal as well as external events and their effect on the stability, throughput and other performance measures on the system to report to the user what cases and conditions seem to cause positive effect on the system performance.

7) Performing sensitivity analysis through simulations for state timing, cycle probabilities and mode changes to identify highest potential changes in the model for specific performance improvements.

8) Identifying critical assets in different modes of operation.

9) Identifying critical cycles for critical assets.

10) Optimizing efficiency of critical cycles by identifying any conditions of waiting for other assets and optimizing the interactions and synchronization between the cycles such that critical assets are never allowed to wait for other assets.

11) Optimizing self-cycle time of critical cycles by identifying non-action states within self cycle because of wait within the asset's own actions, or waits during interface actions.

12) Optimizing cycle time of critical cycles by identifying variance in action timing, and identifying opportunities to bring the action timing to smallest observed timing.

13) Optimizing cycle time of critical cycles by identifying highest sensitivity actions that will enable reduction of cycle time.
14) Identifying loss of efficiency of critical asset by inconsistent interactions due to loss of sync with other assets, or their sync with chain of interlinked assets. Identification of the resulting sync requirement for no interaction losses for critical asset.
15) Identifying sensitivity to frequency and duration of loss of sync happening due to stoppages of assets, and therefore analyzing requirement of buffers for isolation of these effects.
16) Identifying loss of efficiency due to interactions of non-critical assets that result in making these assets critical, and similarly improving their interaction efficiency as if a critical asset.

In various examples, the system behavior model may be used to detect issues, and predict future issues to enable correction, preventative actions, and maintenance of the physical system to keep the physical system operating optimally. The PSS may perform an analysis of the system behavior to look for risks and failure modes. The analysis may include, in an online mode, monitoring conditions that lead to deviations from the optimal model, and the patterns leading to the non-optimal behavior. By monitoring conditions, future deviations may be detected sooner as the undesirable patterns start emerging, and before the actual deviations from the model.

The PSS may also monitor, in the online mode, conditions to detect a changes in the physical model sufficiently large enough to warrant redefining the system behavior model, and assess whether the change is good or bad. In cases where the changes are bad, the PSS may perform actions to revert to a prior system behavior model.

The PSS may also perform correlation analysis with internal as well as external events and their effect on the stability, throughput, and other performance measures on the system and report to a user what cases and conditions seem to cause adverse effects on the system performance.

The basis of the various reports made to the user for improvements are termed "recommendations," which are based upon algorithms and heuristics based upon parameters like tolerances & weightages for various model and deviation attributes. Based upon the feedback from the user as to whether these recommendations were found correct or useful, these parameters resulting in the recommendations are improved by using machine learning techniques to improve the recommendations & learning. Using information gathered from the above analysis, stability improvement steps, optimization steps, recommendation weightages and tolerances, best practices and reference model specifications are created for specific high level processes.

Figure 5:
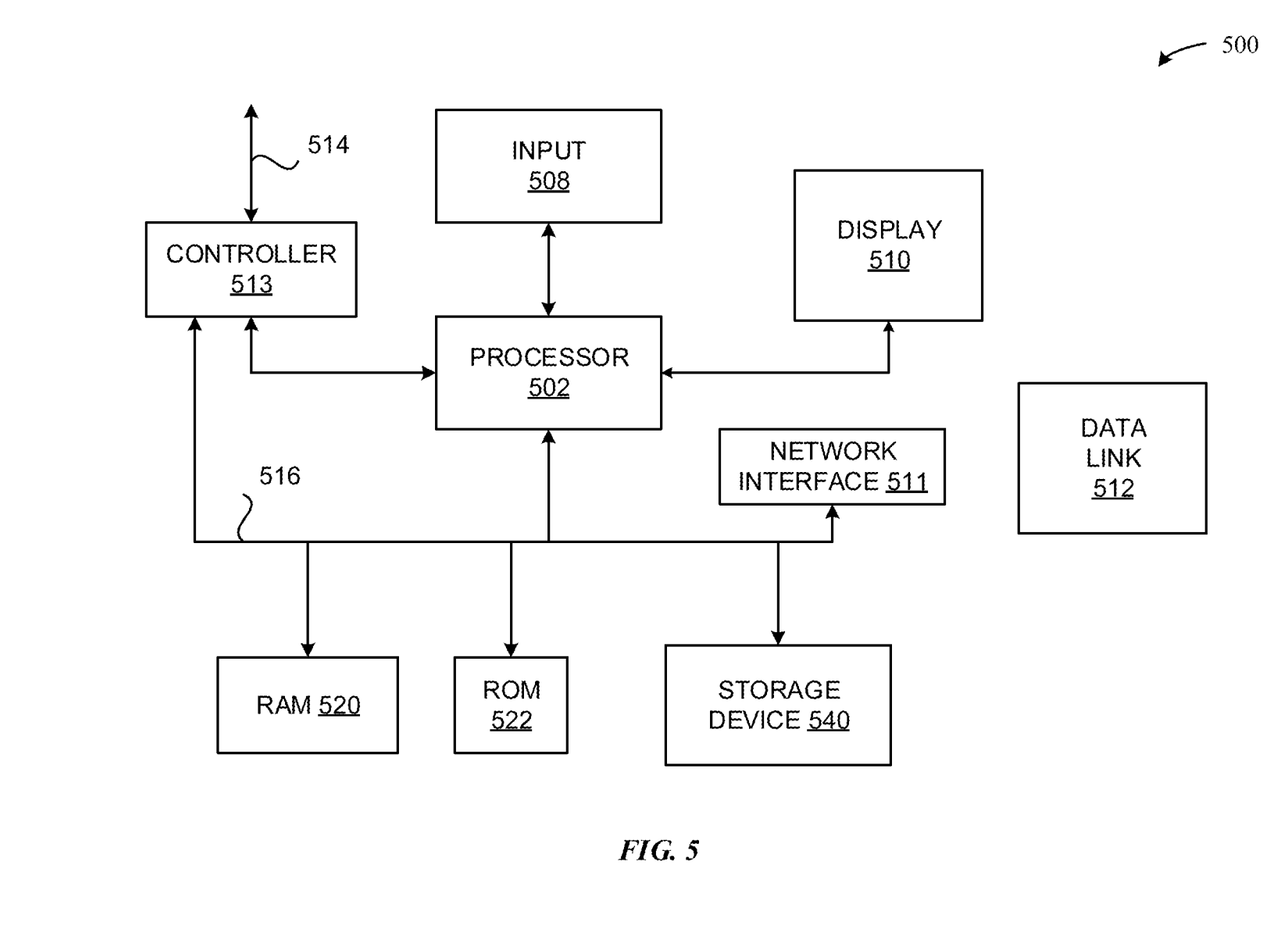
FIG. 5 shows an example computing device used to implement example embodiments as described herein.

FIG. 5 illustrates a detailed view of a computing device 500 that can represent the computing devices used to implement the various techniques described herein, according to some embodiments. For example, the detailed view illustrates various components that can be included in computing device implementing the functionality of the PSS as described above. As shown in FIG. 5, the computing device 500 can include a processor 502 that represents a microprocessor or controller for controlling the overall operation of the computing device 500. The computing device 500 can also include a user input device 508 that allows a user of the computing device 500 to interact with the computing device 500. For example, the user input device 508 can take a variety of forms, such as a button, keypad, dial, touch screen, audio input interface, visual/image capture input interface, input in the form of sensor data, and so on. Still further, the computing device 500 can include a display 510 that can be controlled by the processor 502 (e.g., via a graphics component) to display information to the user. A data bus 516 can facilitate data transfer between at least a storage device 540, the processor 502, and a controller 513. The controller 513 can be used to interface with and control different equipment through an equipment control bus 514. The computing device 500 can also include a network/bus interface 511 that couples to a data link 512. In the case of a wireless connection, the network/bus interlace 511 can include a wireless transceiver.

As noted above, the computing device 500 also includes the storage device 540, which can comprise a single disk or a collection of disks (e.g., hard drives). In some embodiments, storage device 540 can include flash memory, semiconductor (solid state) memory or the like. The computing device 500 can also include a Random-Access Memory (RAM) 520 and a Read-Only Memory (ROM) 522. The ROM 522 as well as Storage Device 540 can store programs, utilities or processes to be executed in a non-volatile manner. The RAM 520 can provide volatile data storage, and stores instructions related to the operation of applications executing on the computing device 500.

Data collection from the Controllers or the various devices from the manufacturing systems, or other Plant & Enterprise systems like SCADA or ERP can be performed on-line (while the PSS software is running on the controller) or off-line (data collection is being done by some other software system, for later import to PSS) through network interface(s) 511, and/or Data link(s) 512. For certain inputs where the data is not available with any of the digitally interfaced systems, data can be entered manually through the input device 508.

Figure 6:
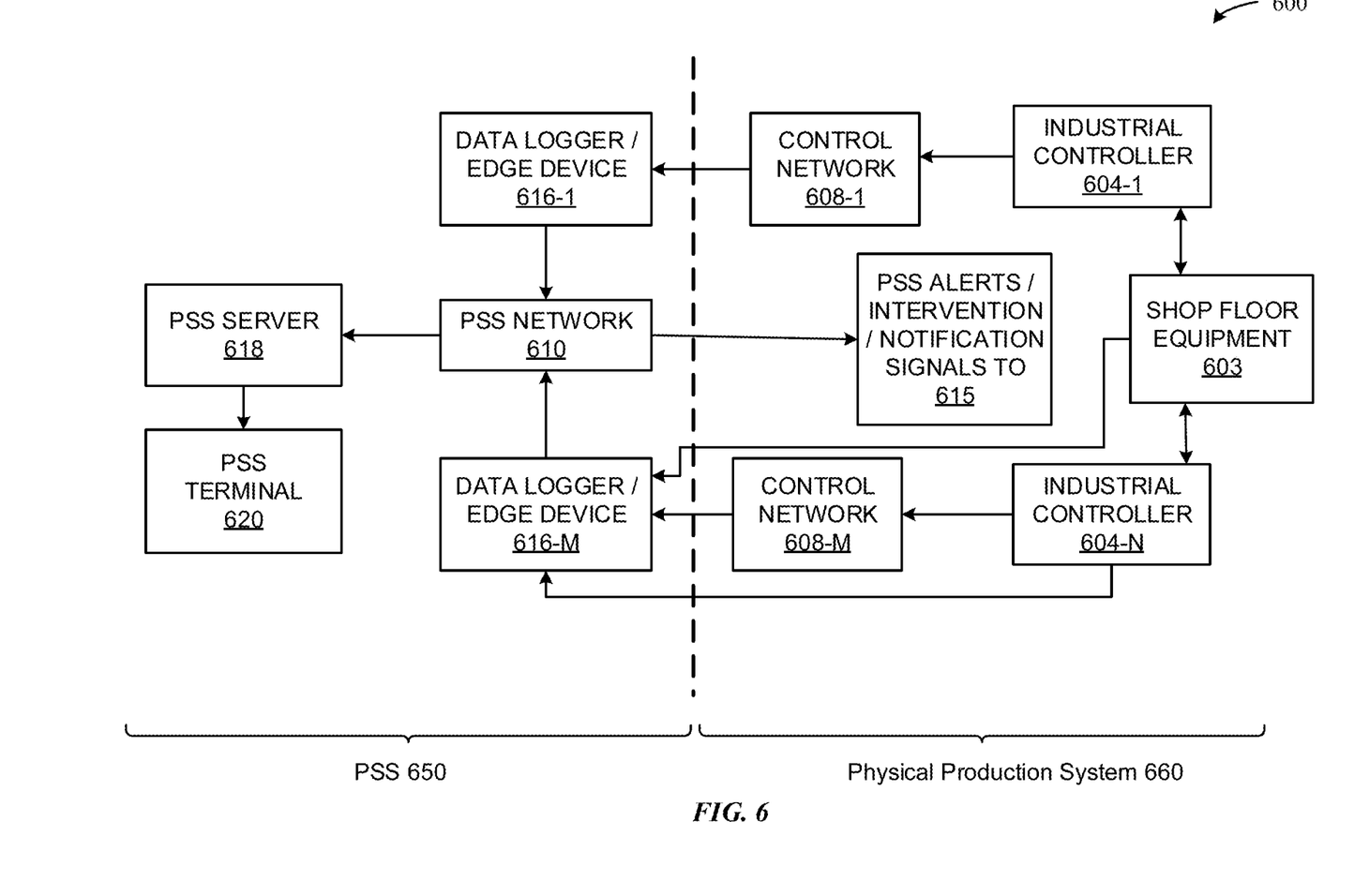
FIG. 6 shows an example PSS architecture in accordance with some embodiments.

FIG. 6 illustrates an example system architecture 600 in accordance with some embodiments. In particular, the system architecture includes the PSS system 650 and the physical production system 660. The physical production system 660 includes shop floor equipment 603 that is controlled by industrial controllers 604, and may be interconnected on control network(s) 608. The PSS server 618 includes the computing system described in (FIG. 5), and connects through a PSS Network 610 to the Data Loggers & Edge Devices 616, which in turn connect on network or direct connections to industrial controllers 604 or shop floor equipment 603.

The PSS server 618 is able to interface with the Shop floor equipment through control networks as well as independent notification systems 615 to provide information, alerts, and when required direct intervention with the shop floor systems (shop floor equipment 603).

The PSS server 618 is then connected through networks, web, and cloud to various data storage, processing and user interface systems on premises, on cloud and mobile. In various embodiments, the PSS terminal 620 is the same as the display 510 (FIG. 5). In some examples the PSS terminal 620 provides a user interface that can be accessed on a mobile user device (e.g., a smartphone, a tablet). In some examples, the PSS terminal 620 renders for display a user interface that is accessed through a cloud. In some examples, the PSS terminal 620 renders for display a user interface on a computing device located on site with the physical system.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

Consistent with the above disclosure, the examples of systems and methods enumerated in the following clauses are specifically contemplated and are intended as a non-limiting set of examples.

Clause 1. A method of building a model of a physical system, comprising:
  receiving a hierarchical tree structure representative of the physical system, wherein the hierarchical tree structure defines system content at various levels of the structure including a node associated with a hardware component or a data sources included in the physical system;
  collecting data associated with the hardware component, the data associated with respective time stamps, wherein the data comprises observational data associated with the physical system;
  deriving, based on the data, node states of the node including first and second node states, wherein a first node state defines a first state of the node, and a second node state defines a second state of the node, wherein the node is only in one node state at a time;
  building a finite state machine (FSM) model, wherein the FSM model defines a sequence of states associated with the node, based at least in pan on the respective time stamps, further wherein the FSM model is part of an overall finite state machine of the physical system; and
  creating the model of the physical system based on the overall finite state machine.

Clause 2. The method of any preceding clause, wherein building the FSM model of the node further comprises:
  attaching first non-state information to the first state of the node, wherein the first non-state information defines a set of data including measurements, system properties, and external variables, wherein individual data of the set of data is associated with a respective time stamp; and
  attaching second non-state information to the second state of the node, wherein the second non-state information defines a second set of data including measurements, system properties, and external variables, wherein individual data of the second set is associated with a respective time stamp.

Clause 3. The method of any preceding clause, further comprising:
  classifying individual multiple node states into a classification based on a duration of a respective node state or an action occurring during the respective node state, wherein the classification comprises at least one selected from the group consisting of: a fixed state, a bound state, a variable state, a dynamic state, or a static state.

Clause 4. The method of any preceding clause, wherein building the FSM model of the node further comprises, filtering out node states occurring in a non-cyclic system mode of operation.

Clause 5. The method of any preceding clause, wherein creating the model of the physical system based on the overall finite state machine further comprises:
  building an interaction model of nodes of the system, wherein a first node of the nodes remains in an interaction state, and wherein the first node transitions out of the interaction state in response to a second node of the nodes transitioning from a particular state.

Clause 6. The method of any preceding clause, wherein receiving a hierarchical tree structure further comprises manual input from a user.

Clause 7. The method of any preceding clause, wherein receiving a hierarchical tree structure further comprises deriving the hierarchical tree structure from the observational data associated with the physical system.

Clause 8. The method of any preceding clause, wherein creating the model of the physical system further comprises:
  defining an event as a good event, wherein the good event results in meeting a performance parameter of the physical system; and
  defining an event as a bad event, wherein the bad event results in the physical system failing to meet a performance parameter of the physical system.

Clause 9. The method of any preceding clause, wherein building the model of the physical system further comprises:
  collecting additional data associated with a plurality of nodes, individual data of the additional data associated with respective time stamps, wherein the additional data comprises additional observational data associated with the physical system;
  deriving, from the additional data, finite states of each of the plurality of nodes, wherein the plurality of nodes includes nodes that are leaf nodes and nodes that are higher level nodes, wherein a higher level node represents a unique combination of states of nodes below the higher level node,
  wherein building the FSM model includes defining a sequence of states associated with the plurality of nodes.

Clause 10. The method of any preceding clause, further comprising:
  optimizing the performance of the model of the physical system by:
    identifying a node that performs outside of defined conditions as an outlier node, wherein the outlier node performs in a manner in accordance with at least one selected from a group comprising: the node takes the most time to perform states without interactions, an asset associated with the node is dependent on another asset, and an asset associated with the node is unavailable due to a failure;
    identifying states of the outlier node including static and wait states;
    eliminating the static and wait states associated with the outlier node;
    identifying delays associated with the asset, when the asset waits for another asset; and
    providing recommendations that synchronize operations between the asset and the another asset.

Clause 11. A Productivity Synthesis System (PSS) implemented, at least in part, on a computing device, the computing device comprising:
  a processor;
  a non-transitory computer-readable media storing instructions that when executed by the processor, cause the processor to:

receive a hierarchical tree structure representative of a physical system, wherein the hierarchical tree structure defines system content at various levels of the structure including a node associated with a hardware component or a data source included in the physical system;

collect data associated with the hardware component, the data associated with respective time stamps, wherein the data comprises observational data associated with the physical system;

derive, based on the data, node states of the node including first and second node states, wherein a first node state defines a first state of the node, and a second node state defines a second state of the node, wherein the node is only in one node state at a time;

build a finite state machine (FSM) model of the node, wherein the FSM model defines a sequence of states associated with the node, based at least in part on the respective time stamps, further wherein the FSM model is part of an overall finite state machine of the physical system; and create the model of the physical system based on the overall finite state machine.

Clause 12. The PSS of any preceding clause, wherein when the non-transitory computer-readable media causes the processor to build a finite state machine model, the non-transitory computer-readable media storing instructions further cause the processor to:

attach first non-state information to the first state of the node, wherein the first non-state information defines a set of data including measurements, system properties, and external variables, wherein individual data of the set of data is associated with a respective time stamp; and attach second non-state information to the second state of the node, wherein the second non-state information defines a second set of data including measurements, system properties, and external variables, wherein individual data of the second set is associated with a respective time stamp.

Clause 13. The PSS of any preceding clause, wherein the non-transitory computer-readable media stores instructions that further cause the processor to: classify individual multiple node states into a classification based on a duration of a respective node state or an action occurring during the respective node state, wherein the classification comprises at least one selected from the group consisting of: a fixed state, a bound state, a variable state, a dynamic state, or a static state.

Clause 14. The PSS of any preceding clause, wherein when the non-transitory computer-readable media causes the processor to build the model of the physical system, the non-transitory computer-readable media stores instructions that further cause the processor to:

collect additional data associated with a plurality of nodes, individual data of the additional data associated with respective time stamps, wherein the additional data comprises additional observational data associated with the physical system;

derive, from the additional data, finite states of each of the plurality of nodes, wherein the plurality of nodes includes nodes that are leaf nodes and nodes that are higher level nodes, wherein a higher level node represents a unique combination of states of nodes below the higher level node, wherein building the FSM model includes defining a sequence of states associated with the plurality of nodes.

Clause 15. The PSS of clause 14, wherein the non-transitory computer-readable media stores instructions that further cause the processor to:

identify a node that performs outside of defined conditions as an outlier node, wherein the outlier node performs in a manner in accordance with at least one selected from a group comprising: the node takes the most time to perform states without interactions, an asset associated with the node is dependent on another asset, and an asset associated with the node is unavailable due to a failure;

identify states of the outlier node including static and wait states;

eliminate the static and wait states associated with the outlier node;

identify delays associated with the asset, when the asset waits for another asset; and provide recommendations that synchronize operations between the asset and the another asset.

Clause 16. The PSS of clause 15, wherein the non-transitory computer-readable media stores instructions that further cause the processor to:

analyze multiple node states of the node, wherein the multiple node states occur during a period of time;

identify cyclic behavior of the multiple node states; and then define a cycle of the node based on the identified cyclic behavior.

Clause 17. A computer-readable media storing instructions that, when executed by a processor of a computer system, cause the computer system to:

receive a hierarchical tree structure representative of a physical system, wherein the hierarchical tree structure defines system content at various levels of the structure including a node associated with a hardware component or a data source included in the physical system;

collect data associated with the hardware component, the data associated with a time stamp, wherein the data comprises observational data associated with the physical system;

derive, based on the data, node states of the node including first and second node states, wherein a first node state defines a first state of the node, and a second node state defines a second state of the node, wherein the node is only in one node stale at a time;

build a finite stale machine (FSM) model of the node, wherein the FSM model defines a sequence of states associated with the node, based at least in part on the time stamp, further wherein the FSM model is part of an overall finite state machine of the physical system; and create the model of the physical system based on the overall finite state machine and interconnection.

Clause 18. The computer-readable media of any preceding clause, wherein when the computer-readable media builds the FSM model, the computer-readable media stores instructions that further cause the computer system to:

attach first non-state information to the first state of the node, wherein the first non-state information defines a set of data including measurements, system properties, and external variables, wherein individual data of the set of data is associated with a respective time stamp; and attach second non-state information to the second state of the node, wherein the second non-state information defines a second set of data including measurements, system properties, and external variables, wherein individual data of the second set is associated with a respective time stamp.

Clause 19. The computer-readable media of any preceding clause, wherein when the computer-readable media causes the computer system to build the model of the physical system, the computer-readable media stores instructions that further causes the computer system to:

collect additional data associated with a plurality of nodes, individual data of the additional data associated with respective time stamps, wherein the additional data comprises additional observational data associated with the physical system;

derive, from the additional data, finite states of each of the plurality of node, wherein the plurality of nodes includes nodes that are leaf nodes and nodes that are higher level nodes, wherein a higher level node represents a unique combination of states of nodes below the higher level node, wherein building the FSM model includes defining a sequence of states associated with the plurality of nodes.

Clause 20. The computer-readable media of clause 19, wherein the computer-readable media stores instructions that further causes the computer system to:

create a digital twin of the physical system, based on the model of the physical system.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

The above discussion is meant to be illustrative of the principles and various embodiments of the present invention. Numerous variations and modifications will become apparent to those skilled in the art once the above disclosure is fully appreciated. For example, Building a model of the system for one-off part production for example prototype or R&D purposes for creation of reference model for studies for process or product improvement, or building a model from a manual system without controllers to capture the human actions through human inputs or actions, or building a model from recorded data like videos or data series, to import the data through an interface. Various limited implementations of the PSS can also be possible embodiments— for example collecting this data without time information to only model sequencing of actions, without the time duration analysis as may be required to analyze effect on quality of following different sequences.

It is intended that the following claims be interpreted to embrace all such variations and modifications.

What is claimed is:

1. A method of building a model of a physical system, comprising:
receiving a hierarchical tree structure representative of the physical system, wherein the hierarchical tree structure defines system content at various levels of the structure including a node associated with a hardware component or a data source included in the physical system;
collecting data associated with the hardware component, the data associated with respective time stamps;
deriving, based on the data, node states of the node including first and second node states, wherein a first node state defines a first state of the node, and a second node state defines a second state of the node, wherein the node is only in one node state at a time;
collecting additional data associated with a plurality of nodes, individual data of the additional data associated with respective time stamps;
deriving, from the additional data, finite states of each of the plurality of nodes, wherein the plurality of nodes includes nodes that are leaf nodes and nodes that are higher level nodes, wherein a higher level node represents a unique combination of states of nodes below the higher level node,
building a finite state machine (FSM) model, wherein the FSM model defines a sequence of states associated with the plurality of nodes, based on the respective time stamps, further wherein the FSM model is part of an overall finite state machine of the physical system;
creating the model of the physical system based on the overall finite state machine; and
optimizing the performance of the model of the physical system by:
identifying a node that performs outside of defined conditions as an outlier node, wherein the outlier node performs in a manner in accordance with at least one selected from a group comprising: the node takes the most time to perform states without interactions, an asset associated with the node is dependent on another asset, and an asset associated with the node is unavailable due to a failure;
identifying states of the outlier node including static and wait states;
eliminating the static and wait states associated with the outlier node;
identifying delays associated with the asset, when the asset waits for another asset; and
providing recommendations that synchronize operations between the asset and the another asset.

2. The method of claim 1, wherein building the FSM model of the node further comprises:
attaching first non-state information to the first state of the node, wherein the first non-state information defines a set of data including measurements, system properties, and external variables, wherein individual data of the set of data is associated with a respective time stamp; and
attaching second non-state information to the second state of the node, wherein the second non-state information defines a second set of data including measurements, system properties, and external variables, wherein individual data of the second set is associated with a respective time stamp.

3. The method of claim 1, further comprising:
classifying individual multiple node states into a classification based on a duration of a respective node state or an action occurring during the respective node state, wherein the classification comprises at least one selected from the group consisting of: a fixed state, a bound state, a variable state, a dynamic state, or a static state.

4. The method of claim 1, wherein building the FSM model of the node further comprises, filtering out node states occurring in a non-cyclic system mode of operation.

5. The method of claim 1, wherein creating the model of the physical system based on the overall finite state machine further comprises:
building an interaction model of nodes of the system, wherein a first node of the interaction model of nodes of the system remains in an interaction state, and wherein the first node of the interaction model of notes of the system transitions out of the interaction state in response to a second node of the interaction model of nodes of the system transitioning from a particular state.

6. The method of claim 1, wherein receiving a hierarchical tree structure further comprises manual input from a user.

7. The method of claim 1, wherein receiving a hierarchical tree structure further comprises deriving the hierarchical tree structure from the data.

8. The method of claim 1, wherein creating the model of the physical system further comprises:
defining an event as a good event, wherein the good event results in meeting a performance parameter of the physical system; and
defining an event as a bad event, wherein the bad event results in the physical system failing to meet a performance parameter of the physical system.

9. A Productivity Synthesis System (PSS) implemented at least in part, on a computing device, the computing device comprising:
a processor;
a non-transitory computer-readable media storing instructions that when executed by the processor, cause the processor to:
receive a hierarchical tree structure representative of a physical system, wherein the hierarchical tree structure defines system content at various levels of the structure including a node associated with a hardware component or a data source included in the physical system;
collect data associated with the hardware component, the data associated with respective time stamps;
derive, based on the data, node states of the node including first and second node states, wherein a first node state defines a first state of the node, and a second node state defines a second state of the node, wherein the node is only in one node state at a time;
collect additional data associated with a plurality of nodes, individual data of the additional data associated with respective time stamps;
derive, from the additional data, finite states of each of the plurality of nodes, wherein the plurality of nodes includes nodes that are leaf nodes and nodes that are higher level nodes, wherein a higher level node represents a unique combination of states of nodes below the higher level node;
build a finite state machine (FSM) model of the node, wherein the FSM model defines a sequence of states associated with the plurality of nodes, based on the respective time stamps, further wherein the FSM model is part of an overall finite state machine of the physical system;
create the model of the physical system based on the overall finite state machine;
identify a node that performs outside of defined conditions as an outlier node, wherein the outlier node performs in a manner in accordance with at least one selected from a group comprising: the node takes the most time to perform states without interactions, an asset associated with the node is dependent on another asset, and an asset associated with the node is unavailable due to a failure;
identify states of the outlier node including static and wait states;
eliminate the static and wait states associated with the outlier node;
identify delays associated with the asset, when the asset waits for another asset
and
provide recommendations that synchronize operations between the asset and the another asset.

10. The PSS of claim 9, wherein when the non-transitory computer-readable media causes the processor to build a finite state machine model, the non-transitory computer-readable media storing instructions further cause the processor to:
attach first non-state information to the first state of the node, wherein the first non-state information defines a set of data including measurements, system properties, and external variables, wherein individual data of the set of data is associated with a respective time stamp; and
attach second non-state information to the second state of the node, wherein the second non-state information defines a second set of data including measurements, system properties, and external variables, wherein individual data of the second set is associated with a respective time stamp.

11. The PSS of claim 9, wherein the non-transitory computer-readable media stores instructions that further cause the processor to: classify individual multiple node states into a classification based on a duration of a respective node state or an action occurring during the respective node state, wherein the classification comprises at least one selected from the group consisting of: a fixed state, a bound state, a variable state, a dynamic state, or a static state.

12. The PSS of claim 9, wherein the non-transitory computer-readable media stores instructions that further cause the processor to:
analyze multiple node states of the node, wherein the multiple node states occur during a period of time;
identify cyclic behavior of the multiple node states; and then
define a cycle of the node based on the identified cyclic behavior.

* * * * *